(12) United States Patent
Johnstone et al.

(10) Patent No.: US 6,803,160 B2
(45) Date of Patent: Oct. 12, 2004

(54) MULTI-TONE PHOTOMASK AND METHOD FOR MANUFACTURING THE SAME

(75) Inventors: Eric V. Johnstone, Round Rock, TX (US); Franklin D. Kalk, Austin, TX (US)

(73) Assignee: DuPont Photomasks, Inc., Round Rock, TX (US)

( * ) Notice: Subject to any disclaimer, the term of this patent is extended or adjusted under 35 U.S.C. 154(b) by 0 days.

(21) Appl. No.: 10/317,565

(22) Filed: Dec. 12, 2002

(65) Prior Publication Data

US 2003/0118920 A1 Jun. 26, 2003

Related U.S. Application Data

(60) Provisional application No. 60/341,478, filed on Dec. 13, 2001.

(51) Int. Cl.[7] .............................. G03F 9/00; G03C 5/00
(52) U.S. Cl. ........................................... 430/5; 430/323
(58) Field of Search ........................... 430/5, 323, 322, 430/324, 312, 313, 314, 315, 316, 317, 318

(56) References Cited

U.S. PATENT DOCUMENTS

| | | | |
|---|---|---|---|
| 5,914,202 A | 6/1999 | Nguyen et al. ............... 430/5 |
| 6,017,658 A | * 1/2000 | Rhee et al. ................... 430/5 |
| 6,159,643 A | 12/2000 | Levinson et al. ............. 430/5 |
| 6,162,587 A | 12/2000 | Yang et al. ................. 430/314 |
| 6,165,695 A | 12/2000 | Yang et al. ................. 430/314 |
| 6,178,221 B1 | 1/2001 | Levinson et al. ............ 378/35 |
| 6,306,560 B1 | 10/2001 | Wang et al. ................ 430/316 |

OTHER PUBLICATIONS

International Search Report PCT/US 02/40029, Mailing Mar. 19, 2003.

* cited by examiner

Primary Examiner—Saleha R. Mohamedulla
(74) Attorney, Agent, or Firm—Baker Botts L.L.P.

(57) ABSTRACT

A multi-tone photomask and method for manufacturing the same are disclosed. A photomask includes a filter layer formed on at least a portion of a substrate. The filter layer includes a first pattern formed by a first etch process. A barrier layer including the first pattern is formed on at least a portion of the filter layer by a second etch process. An absorber layer including a second pattern is formed on at least a portion of the barrier layer by a third etch process. The barrier layer further acts as an etch stop for the third etch process.

25 Claims, 2 Drawing Sheets

MULTI-TONE PHOTOMASK AND METHOD FOR MANUFACTURING THE SAME

CROSS REFERENCE TO RELATED APPLICATION

This application claims priority from U.S. Provisional Patent Application Ser. No. 60/341,478, filed Dec. 13, 2001, and entitled "Multi-Tone Photomask and Method for Manufacturing the Same."

TECHNICAL FIELD OF THE INVENTION

The present invention relates in general to photolithography and, more particularly to a multi-tone photomask and method for manufacturing the same.

BACKGROUND OF THE INVENTION

As semiconductor device manufacturers continue to produce smaller devices, the requirements of photomasks used in the fabrication of these devices continue to tighten. Photomasks, also known as reticles or masks, typically include substrates (e.g., high-purity quartz or glass) that have an absorber layer (e.g., chrome) formed on a substrate. The absorber layer includes a pattern representing a circuit image that may be transferred onto semi-conductor wafers in a lithography process. As feature sizes of semiconductor devices decrease, the corresponding circuit images on the photomask also become smaller and more complex. Consequently, the quality of the mask has become one of the most crucial elements in establishing a robust and reliable semiconductor fabrication process.

In some semiconductor fabrication processes, a special photomask may be used to image a pattern on to a surface. One example of a special photomask is a tri-tone photomask. A conventional tri-tone mask typically includes at least two material layers formed on a substrate, where each type of material transmits a different percentage of an exposure wavelength from a lithography system.

A tri-tone photomask may be manufactured using a conventional additive process. In a conventional additive process, a binary photomask may be formed by imaging a pattern into a resist layer of a photomask blank, developing the resist layer, etching exposed portions of the absorber layer and stripping the remaining resist layer. Another pattern may then be formed on the photomask blank by depositing another resist layer, imaging the pattern in the resist layer, developing the resist layer and etching exposed portions of the absorber layer. Before the remaining resist layer is removed, the photomask blank may be sent to a third party supplier to deposit a filter layer of partially transmissive material. The remaining resist layer under the filter layer is then removed to form the tri-tone photomask.

Numerous problems may occur during the fabrication process. Typically, the partially transmissive material is not deposited uniformly over the surface of the photomask because of the different surface elevations on the photomask. For example, the thickness of the partially transmissive material may vary or be inconsistent near the edges of features. These variations in thickness and inconsistencies near the edges of the features may cause light scattering or otherwise affect reflectivity, which can corrupt the projected image. The thicker part of the partially transmissive material may also be fragile and susceptible to degradation, which can cause feature uniformity problems at the interface of the absorber layer and partially transmissive material.

Problems may also occur because the photomask must be sent to a third party supplier in the middle of the fabrication process. Defects may be caused by the extra handling that occurs when the photomask is sent to the third party supplier. Furthermore, the amount of time that is needed by a photomask manufacturer to fabricate the tri-tone mask is increased because the manufacturer must send the mask to a third party supplier.

Problems may also continue when the photomask is used in the manufacturing process. Because the partially transmissive material is exposed, it may undergo oxidation that may change the transmissive properties of the material. This may result in a reduction of the usable life span of the photomask.

SUMMARY OF THE INVENTION

Therefore, a need has arisen for a method for manufacturing a multi-tone photomask which does not require the photomask to be sent to a third party supplier to add a filter layer during the manufacturing process.

A further need exists for a photomask which has pre-deposited filter layer that meets optical specifications provided by a manufacturer.

A further need exists for a photomask which provides a protective coating on a filter layer such that the filter layer does not oxidize over time.

In accordance with teachings of the present invention, disadvantages and problems associated with manufacturing a multi-tone photomask have been substantially reduced or eliminated. A barrier layer located between an absorber layer and a filter layer on a photomask acts as an etch stop for the absorber layer and provides a protective coating to prevent the filter layer from being oxidized over the lifetime of the photomask.

More specifically, a filter layer formed on at least a portion of substrate includes a first pattern created by using a wet etch process. The absorber layer further includes a first etch characteristic. A barrier layer formed on at least a portion of the filter layer has a second etch characteristic and provides a protective coating that prevents the filter layer from oxidizing over time. The barrier layer includes the first pattern formed by a dry etch process. An absorber layer that includes a second pattern formed by the wet etch process is formed on at least a portion of the barrier layer. The barrier layer is inert to the wet etch process and further provides an etch stop for the wet etch process.

In one embodiment, a photomask includes a filter layer formed on at least a portion of a substrate, a barrier layer formed on at least a portion of the filter layer and an absorber layer formed on at least a portion of the barrier layer. The filter layer includes a first pattern formed by a first etch process and the barrier layer includes the first pattern formed by a second etch process. The absorber layer includes a second pattern formed by a third etch process. The barrier layer provides an etch stop for the third etch process.

In another embodiment, the absorber layer and the filter layer include a first etch characteristic such that exposed portions of the layers are removed by wet etch processes. The barrier layer includes a second etch characteristic such that exposed portions of the barrier layer are inert to the wet etch process and the exposed portions are removed by a dry etch process. The barrier layer further provides a protective coating to prevent the filter layer from oxidizing.

In a further embodiment, the filter layer is a neutral density material that transmits less than approximately fifty percent of radiant energy and the absorber layer transmits approximately zero percent of radiant energy. The barrier layer is silicon dioxide or aluminum oxide and includes a thickness approximately equal to one quarter of an exposure wavelength.

In one embodiment of the present invention, a photomask includes a filter layer with a first etch characteristic and a first transmittance. A barrier layer with a second etch characteristic is formed on the filter layer. An absorber layer is formed on the barrier layer. The absorber layer includes the first etch characteristic and a second transmittance. The second etch characteristic of the barrier layer is inert to the etch processes used on the absorber and filter layers.

In an additional embodiment of the present invention, a method for manufacturing a photomask includes providing a photomask with a barrier layer located between an absorber layer and filter layer. A first pattern is formed on the absorber layer using a first etch process. The first etch process is stopped by the barrier layer. A second pattern is formed on the barrier layer by a second etch process. The second pattern is formed in the filter layer by using a third etch process.

Important technical advantages of certain embodiments of the present invention include a photomask blank that decreases the time needed to fabricate a multi-tone photomask. The blank includes a pre-deposited filter layer formed on a substrate. Since the blank includes the filter layer, a photomask manufacturer does not have to interrupt a photomask manufacturing process to send the partially fabricated photomask to a third party supplier. Furthermore, the throughput and yield may increase since the extra handling steps associated with transporting the photomask between manufacturing facilities is eliminated.

Another important technical advantages of certain embodiments of the present invention includes a filter layer that may be optically measured and qualified before beginning a photomask fabrication process. Since the filter layer is deposited before a photomask fabrication process begins, the filter layer may be deposited according to specifications provided by a photomask manufacturer or a semiconductor manufacturer. The filter layer, therefore, may have a uniform thickness across the surface of a photomask. The filter layer may also be varied in composition to meet optical specifications of the manufacturer.

A further important technical advantage of certain embodiments of the present invention includes a barrier layer that prevents optical characteristics associated with a filter layer from changing over time. The barrier layer is formed on at least a portion of the filter layer and provides a protective coating that effectively seals areas of the filter layer not covered by an absorber layer. The barrier layer, therefore, protects the filter layer during a manufacturing process and prevents oxidation from altering the optical characteristics of the filter layer.

BRIEF DESCRIPTION OF THE DRAWINGS

A more complete and thorough understanding of the present embodiments and advantages thereof may be acquired by referring to the following description taken in conjunction with the accompanying drawings, in which like reference numbers indicate like features, and wherein.

DETAILED DESCRIPTION OF THE INVENTION

Figure 1:
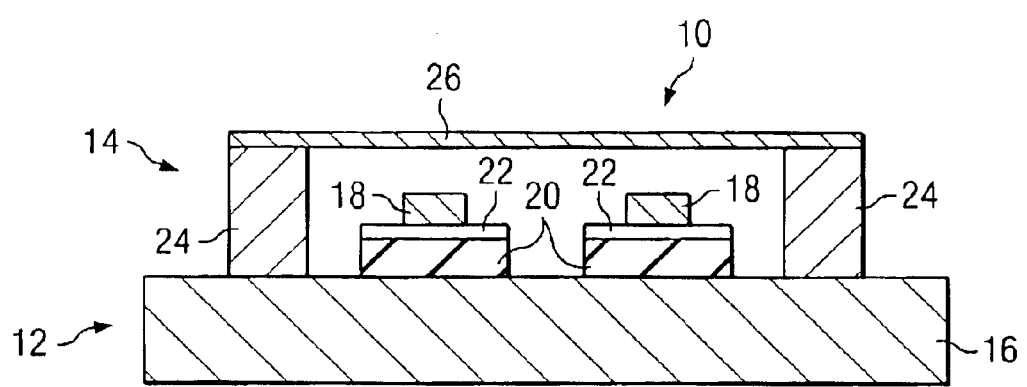
FIG. 1 illustrates a cross-sectional view of a photomask assembly that includes a barrier layer according to teachings of the present invention.

Preferred embodiments of the present invention and their advantages are best understood by reference to FIGS. 1 and 2, where like numbers are used to indicate like and corresponding parts.

A photomask is a crucial component of a lithography system because it serves as the template that images a complex geometry on a surface. For example a photomask may be used to form an integrated circuit (IC) on a wafer or a design on a photosensitive polymer film. Some ICs and designs require advanced design photomasks, such as a tri-tone or multi-tone photomask. The multi-tone photomask typically includes multiple types of materials that may have different transmittances. In a conventional process, a partially transmissive material may be deposited on to a partially fabricated photomask by a third party supplier. During the fabrication process, a photomask manufacturer sends the photomask to the third party supplier to deposit the partially transmissive material. Sending a photomask to a third party supplier increases production time and increases the risk that the photomask may be damaged by defects caused by the additional handling steps. The present invention eliminates the additional handling steps and decreases the time needed to manufacture the photomask since the filter layer is deposited onto a photomask blank before the fabrication process begins. The filter layer also may be formed with appropriate specifications that are provided by a photomask manufacturer or a semiconductor manufacturer.

FIG. 1 illustrates a cross-sectional view of photomask assembly 10. In the illustrated embodiment, photomask assembly 10 includes photomask 12 coupled to pellicle assembly 14. Substrate 16, absorber layer 18, filter layer 20, and barrier layer 22 form photomask 12. Although the illustrated embodiment of photomask 12 includes three material layers on the substrate 16, any suitable number of material layers may be included. In one embodiment, photomask 12 includes a plurality of absorber layers and plurality of filter layers separated by a plurality of barrier layers.

Photomask 12, otherwise known as a mask or reticle, may have a variety of sizes and shapes, including but not limited to annular, rectangular, or square. Photomask 12 may also be any variety of photomask types, including, but not limited to, a one-time master, a five-inch reticle, a six-inch reticle, a nine-inch reticle or any appropriately sized reticle that may be used to project an image onto a surface, such as a wafer or a film. Photomask 12 may further be a binary mask, a phase shift mask, an optical proximity correction (OPC) mask, or any other type of mask suitable for use in a lithography system.

Photomask 12 includes absorber layer 18 and filter layer 20 formed on substrate 16 that create a pattern on a surface of photomask 12. When photomask assembly 10 is placed in a lithography system, the pattern defined by absorber layer 18 and filter layer 20 is projected onto the surface of a wafer or film (not expressly shown).

For some applications, substrate 16 may be a material such as quartz, synthetic quartz, fused silica, magnesium fluoride ($MgF_2$), calcium fluoride ($CaF_2$), or any other suitable material that transmits at least seventy-five percent (75%) of incident light having a wavelength between approximately 10 nanometers (nm) and approximately 450 nm. In an alternative embodiment, substrate 16 may be a reflective material such as silicon or any other suitable material that reflects greater than approximately fifty percent (50%) of incident light having a wavelength between approximately 10 nm and 450 nm.

Absorber layer 18 may be a material such as chrome, chromium nitride, a metallic oxy-carbo-nitride, where the metal is selected from the group consisting of chromium, cobalt, iron, zinc, molybdenum, niobium, tantalum, titanium, tungsten, aluminum, magnesium and silicon, and any other suitable material that absorbs electromagnetic energy with wavelengths in the ultraviolet (UV) range, deep ultraviolet (DUV) range, vacuum ultraviolet (VUV) range and/or extreme ultraviolet range (EUV). In one embodiment, the transmissivity of the absorber layer is approximately zero. In an alternative embodiment, absorber layer 18 may be a partially transmissive material, such as molybdenum silicide (MoSi), which has a transmissivity of approximately one percent (1%) to approximately thirty percent (30%) in the UV, DUV, VUV and/or EUV ranges.

Filter layer 20 may be any neutral density (ND) filter material, such as INCONEL™ manufactured by Inco Alloys International, Inc., a nickel alloy, a nickel-chrome alloy, a nickel-chrome-iron alloy, a chromium alloy, or any other suitable material that has a transmissivity of less than approximately fifty percent (50%) in the UV, DUV, VUV and/or EUV ranges. In another embodiment, the filter material may be molybdenum silicide or any type of partially transmissive material that is tuned to a thickness that will give the correct transmissivity for a given exposure wavelength. In one embodiment, the filter layer has a transmissivity greater than the transmissivity of the absorber layer.

Barrier layer 22 may be silicon dioxide ($SiO_2$), magnesium fluoride ($MgF_2$), or aluminum oxide ($Al_2O_3$). In another embodiment, barrier layer 22 may be a material such as aluminum nitride (AlN), silicon nitride ($Si_3N_4$), tantalum oxide ($Ta_2O_5$), yttrium oxide ($Y_2O_3$), magnesium oxide (MgO), zirconium oxide ($ZrO_2$), lithium fluoride (LiF), aluminum fluoride ($AlF_3$), calcium fluoride ($CaF_2$), or any other suitable material that transmits light and is resistant to an etch process used to form a pattern in filter layer 20 and/or absorber layer 18. In one embodiment, barrier layer 22 may have a thickness of approximately equal to one quarter of an exposure wavelength used in a lithography system.

Frame 24 and pellicle film 26 may form pellicle assembly 14. Frame 24 is typically formed of anodized aluminum, although it could alternatively be formed of stainless steel, plastic or other suitable materials that do not degrade or outgas when exposed to electromagnetic energy within a lithography system. Pellicle film 26 may be a thin film membrane formed of a material such as nitrocellulose, cellulose acetate, an amorphous fluoropolymer, such as Teflon® AF manufactured by E. I. du Pont de Nemours and Company, CYTOP® manufactured by Asahi Glass, or another suitable film that is transparent to wavelengths in the UV, DUV, VUV and/or EUV ranges. Pellicle film 26 may be prepared by a conventional technique such as spin casting.

Pellicle film 26 protects photomask 12 from contaminants, such as dust particles, by ensuring that the contaminants remain a defined distance away from photomask 12. This may be especially important in a lithography system. During a lithography process, photomask assembly 10 is exposed to electromagnetic energy produced by an energy source within the lithography system. The electromagnetic energy may include light of various wavelengths, such as wavelengths approximately between the I-line and G-line of a Mercury arc lamp, or DUV, VUV or EUV light. In operation, pellicle film 26 is designed to allow a large percentage of the electromagnetic energy to pass through it. Contaminants collected on pellicle film 26 will likely be out of focus at the surface of the wafer or film being processed and, therefore, the exposed image on the wafer or film should be clear. Pellicle film 26 formed in accordance with the teachings of the present invention may be satisfactorily used with all types of electromagnetic energy and is not limited to lightwaves as described in this application.

Photomask 12 may be formed from a photomask blank using a fabrication process described in more detail below. In one embodiment, a photomask blank that may be used to fabricate photomask 12 may include a resist layer, absorber layer 18, barrier layer 22, filter layer 20 and substrate 16. Filter layer 20 may be formed on substrate 16 and barrier layer 22 may be formed on filter layer 20. Filter layer 20 may be used to change optical characteristics associated with photomask 12 and barrier layer 22 may be used to stop an etch process between two layers with similar etch characteristics. Absorber layer 18 may be formed on barrier layer 22 and the resist layer may be formed on absorber layer 18. The addition of barrier layer 22 and filter layer 20 to the photomask blank reduces the amount of handling required during the photomask fabrication process since the photomask does not have to be sent to a third party supplier to deposit filter layer 20. Filter layer 20 may also have more uniform characteristics since it can be deposited according to specifications provided by a semiconductor manufacturer or a photomask manufacturer. Additionally, barrier layer 22 may also protect filter layer 20 from being oxidized during the life of photomask 12.

Both absorber layer 18 and filter layer 20 may be formed on photomask 12 using a standard lithography process. In a standard lithography process, a mask pattern file that includes data for absorber layer 18 and a mask pattern file that includes data for filter layer 20 may be generated from a mask layout file.

In one embodiment, the mask layout file may include polygons that represent transistors and electrical connections for an integrated circuit. The polygons in the mask layout file may further represent different layers of the integrated circuit when it is fabricated on a semiconductor wafer. For example, a transistor may be formed on a semiconductor wafer with a diffusion layer and a polysilicon layer. The mask layout file, therefore, may include one or more polygons drawn on the diffusion layer and one or more polygons drawn on the polysilicon layer. The polygons for each layer may be converted into a mask pattern file that represents one layer of the integrated circuit. Each mask pattern file may be used to generate a photomask for the specific layer.

In another embodiment, the mask layout file may include patterns to be transferred onto a photosensitive film. The patterns in the mask layout file may further represent different layers of the pattern when it is fabricated on the film. Each mask pattern file may be used to generate a photomask for the specific layer.

The desired pattern from a mask pattern file may be imaged into a resist layer of the photomask blank using a laser, electron beam or X-ray lithography system. In one embodiment, a laser lithography system uses an Argon-Ion laser that emits light having a wavelength of approximately 364 nanometers (nm). In alternative embodiments, the laser lithography system uses lasers emitting light at wavelengths from approximately 150 nm to approximately 300 nm.

A pattern may be formed in absorber layer 18 on photomask 12 by developing exposed areas of the resist layer, etching the portions of absorber layer 18 not covered by resist, and removing the undeveloped resist to create the pattern. In one embodiment, the etch process may be a wet etch. Barrier layer 22 on the photomask blank may be inert to a wet etch and therefore, may act as a mechanism to stop the etch process. In another embodiment, the etch process may be a dry etch. In this embodiment, barrier layer 22 may be inert to the dry etch and may act as an etch stop for the etch process. Once the appropriate portions of absorber layer 18 have been removed to form the desired pattern, another layer of resist is deposited on absorber layer 18 and any exposed areas of barrier layer 22. A mask pattern file containing data for filter layer 20 is used to expose areas of the resist layer to create another pattern. The resist layer is then developed. Barrier layer 22 and the filter layer 20 are etched in order to expose portions of substrate 16. In one embodiment, a dry etch process is used to remove barrier layer 22 and a wet etch process is used to remove filter layer 20. In another embodiment, a dry etch process is used to remove both barrier layer 22 and filter layer 20. In a further embodiment, a wet etch is used to remove barrier layer 22 and a dry etch is used to remove filter layer 20.

FIGS. 2A through 2F illustrate cross-sectional views of photomask 12 at various steps of a manufacturing process. Generally, conventional lithography, developing, etching, and stripping techniques are used to fabricate photomask 12 from photomask blank 30. An etch process may be used to remove a material (e.g., the material used to form absorber layer 18, filter layer 20 and/or barrier layer 22) from the surface of a photomask. Both wet and dry etch processes may be used. In a wet etch, a liquid etching agent is used to remove exposed areas on the surface. In one embodiment, a liquid solution of acetic acid and ceric ammonium nitrate may be used to wet etch a material such as chromium. In a dry etch, plasma is used to remove exposed materials from the surface. In one embodiment, a plasma mixture of methane, chlorine and boron trichloride may be used to dry etch a material such as aluminum. In other embodiments a variety of chemicals including acids, alkalis and oxidizing agents may be used for wet and dry etch processes.

The chemical used in a particular etch process depends on the type of material being removed by the etch. For example, a material has an etch characteristic such that the material reacts with some chemicals, which may remove portions of the material from the surface of the photomask, and is inert to other chemicals. Therefore, the etch characteristic associated with a material determines what type of etch processes (e.g., a wet etch or a dry etch) may be used to remove portions of the material from the surface of photomask blank 30. In one embodiment, a wet etch process may be used to remove different types of materials, such as absorber layer 18 and filter layer 20. In another embodiment, more than one etch process may remove a certain type of material. Similarly, different dry etch processes may remove a certain type of material and one dry etch process may remove more than one type of material.

Figure 2A:
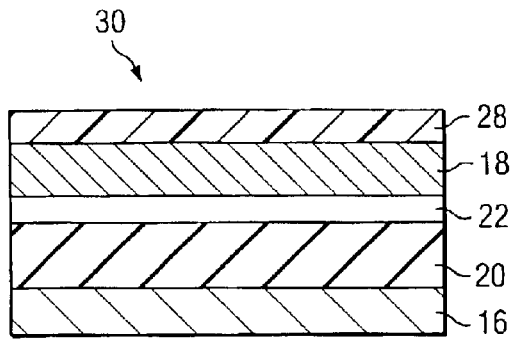
FIGS. 2A through 2F illustrate cross-sectional views of a photomask blank at various steps of a photomask manufacturing process.

Although the illustrated embodiment for photomask blank 30 includes four material layers formed on substrate 16, any suitable number of material layers may be included. As illustrated in FIG. 2A, photomask blank 30 may include resist layer 28 formed on absorber layer 18. Resist layer 28 may be any positive or negative photoresist that can be exposed with wavelengths between approximately 150 nm and 350 nm. In one embodiment, resist layer 28 may have a thickness of approximately 5000 angstroms to approximately 6000 angstroms. In another embodiments, the thickness of resist layer 28 may be any suitable value for use in a specific lithography system.

In one embodiment, absorber layer 18 may be a material that has a transmittance of approximately zero percent. In another embodiment, absorber layer 18 may be a partially transmissive material that has a transmissivity of approximately one percent (1%) to thirty percent (30%). Absorber layer 18 may have a thickness between approximately 500 angstroms and approximately 2000 angstroms. In other embodiments, the thickness of absorber layer 18 may be any appropriate value for use in a specific fabrication process.

Barrier layer 22 may be located between absorber layer 18 and filter layer 20, which is formed on substrate 16. Barrier layer 22 may be silicon dioxide ($SiO_2$), magnesium fluoride ($MgF_2$), or aluminum oxide ($Al_2O_3$). In another embodiment, barrier layer 22 may be a material such as aluminum nitride (AlN), silicon nitride ($Si_3N_4$), tantalum oxide ($Ta_2O_5$), yttrium oxide ($Y_2O_3$), magnesium oxide (MgO), zirconium oxide ($ZrO_2$), lithium fluoride (LiF), aluminum fluoride ($AlF_3$), calcium fluoride ($CaF_2$), or any other suitable material that has a different etch characteristic than absorber layer 18 and filter layer 20 such that barrier layer 22 acts as an etch stop for an etch process. Barrier layer 22 may further seal filter layer 20 to prevent oxidation from occurring and changing optical properties of filter layer 20 during the fabrication process and throughout the lifetime of photomask 12. Barrier layer 22 may be tuned to obtain specific optical properties for a selected lithography process by adjusting the thickness of barrier layer 22. In one embodiment, barrier layer 22 may have a thickness of approximately 100 angstroms. In another embodiment, barrier layer 22 includes a thickness approximately equal to one quarter of an exposure wavelength. In a further embodiment, barrier layer 22 may have a thickness suitable for use in a specific fabrication process.

Filter layer 20 may be INCONEL™ manufactured by Inco Alloys International, Inc., molybdenum silicide, any suitable nickel alloy (e.g. a nickel-chromium alloy, a nickel-chromium-iron alloy), a chromium alloy, or any other suitable neutral density (ND) material that may alter optical characteristics associated with a photomask when electromagnetic energy is projected onto the photomask. Examples of such electromagnetic energy include, but are not limited to ultra violet (UV), deep ultra violet (DUV), extreme ultra violet (EUV) and X-rays. Filter layer 20 may have a thickness according to specifications provided by either a photomask manufacturer or a semiconductor manufacturer. Filter layer 20 may also be varied in composition to meet the optical specifications of the manufacturer. In one embodiment, substrate 16 may have a thickness of approximately 0.25 inches.

Figure 2D:
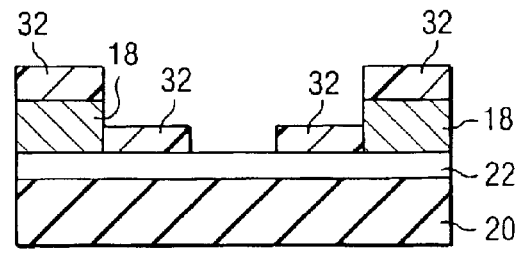
Figure 2B:
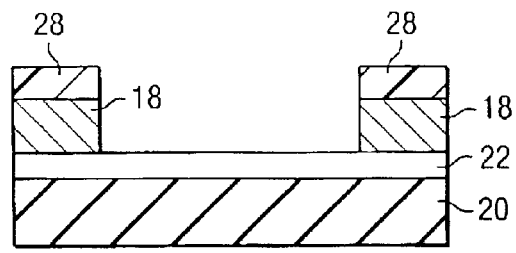

As illustrated in FIG. 2B, a pattern from a mask pattern file may be imaged into resist layer 28 using a lithography system. Resist layer 28 is developed to remove the resist material in the exposed areas and absorber layer 18 is etched to remove the absorber material and expose portions of barrier layer 22. In one embodiment, absorber layer 18 and filter layer 20 may have similar etch characteristics such that a wet etch removes the material used to form absorber layer 18 and filter layer 20. In another embodiment, absorber layer 18 and filter layer 20 may have different etch characteristics such that absorber layer 18 may be removed by a wet etch process using one type of chemical and filter layer 20 may be removed by a different wet etch processing using another type of chemical. In either embodiment, barrier layer 22 may have a different etch characteristic than either of absorber layer 18 and/or filter layer 20 such that barrier layer 22 is inert to wet etch processes and may be removed with a dry etch process. Therefore, barrier layer 22 may stop the wet etch process used to remove absorber layer 18 at the interface of absorber layer 18 and barrier layer 22.

In a further embodiment, dry etch processes may be used to remove portions of absorber layer 18, filter layer 20 and barrier layer 22. Absorber layer 18 and filter layer 20 may have different etch characteristics than barrier layer 22 such that a different type of plasma may be used to remove absorber layer 18 and filter layer 20. Again, barrier layer 22 acts as an etch stop for the dry etch process used to remove portions of absorber layer 18. In an additional embodiment, filter layer 20 and barrier layer 22 may have similar etch characteristics and absorber layer 18 may have a different etch characteristic. Filter layer 20 and barrier layer 22 may be removed with a dry etch process and absorber layer 18 may be removed with a wet etch process. After the appropriate pattern has been formed in absorber layer 18, the remaining resist material is removed from the remaining absorber material.

Figure 2E:
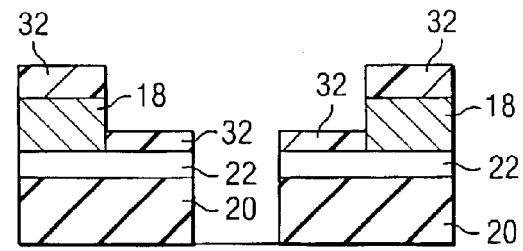
Figure 2C:
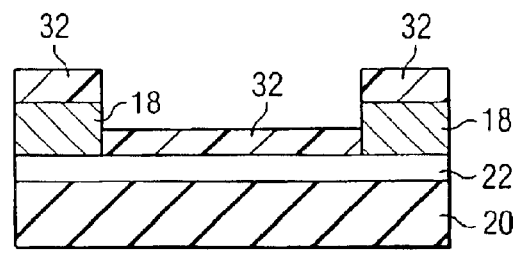

As illustrated in FIG. 2C, resist layer 32 is formed on absorber layer 18 and the exposed areas of barrier layer 22. Another pattern from an additional mask pattern file that includes data for filter layer 20 may be imaged into resist layer 32.

As illustrated in FIG. 2D, resist layer 32 is developed to removed the resist material in the exposed area. Barrier layer 22 and filter layer 20 are then etched to remove the barrier material and the filter material to expose portions of substrate 16, as illustrated in FIG. 2E. In one embodiment, barrier layer 22 is removed with a dry etch process and filter layer 20 is removed with a wet etch process. In another embodiment, both barrier layer 22 and filter layer 20 are removed with a dry etch process. In a further embodiment, barrier layer 22 is removed with a wet etch, and filter layer 20 is removed with a dry etch. In an additional embodiment, a dry etch process may be used to remove the resist material. In this example, barrier layer 22 does not provide an etch stop and the etching process may simultaneously remove the resist material, the barrier material and the filter material in one process.

Figure 2F:
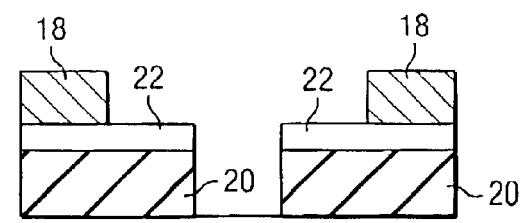

As illustrated in FIG. 2F, remaining portions of resist layer 32 are removed to form photomask 12. Photomask 12 is then cleaned and pellicle assembly 14 is mounted on photomask 12 to form photomask assembly 10.

Although the present invention has been described with respect to a specific preferred embodiment thereof, various changes and modifications may be suggested to one skilled in the art and it is intended that the present invention encompass such changes and modifications fall within the scope of the appended claims.

What is claimed is:

1. A photomask, comprising:
   a filter layer formed on at least a portion of a substrate, the filter layer including a first pattern formed by a first etch process;
   a barrier layer formed on at least a portion of the filter layer, the barrier layer including the first pattern formed by a second etch process; and
   an absorber layer formed on at least a portion of the barrier layer, the absorber layer including a second pattern formed by a third etch process, the barrier layer operable to stop the third etch process.

2. The photomask of claim 1, further comprising:
   the absorber layer and the filter layer including a first etch characteristic; and
   the barrier layer including a second etch characteristic different from the first etch characteristic.

3. The photomask of claim 1, further comprising:
   the filter layer operable to transmit a first percentage of radiant energy; and
   the absorber layer operable to transmit a second percentage of radiant energy, the first percentage greater than the second percentage.

4. The photomask of claim 1, wherein:
   the first and third etch processes comprise a wet etch; and
   the second etch process comprises a dry etch.

5. The photomask of claim 1, wherein the first and third etch processes comprise a first dry etch; and
   the second etch process comprises a second dry etch.

6. The photomask of claim 1, wherein the first and third etch processes comprise a dry etch; and
   the second etch process comprises a wet etch.

7. The photomask of claim 1, wherein the filter layer comprises a neutral density material.

8. The photomask of claim 1, wherein the filter layer comprises molybdenum silicide (MoSi).

9. The photomask of claim 1, wherein the barrier layer comprises a material selected from the group consisting of silicon dioxide ($SiO_2$), magnesium fluoride ($MgF_2$), and aluminum oxide ($Al_2O_3$).

10. The photomask of claim 1, further comprising the barrier layer including a thickness approximately equal to one quarter of an exposure wavelength.

11. The photomask of claim 1, further comprising the barrier layer providing a protective coating over the filter layer to prevent the filter layer from oxidizing.

12. A photomask, comprising:
    a filter layer formed on at least a portion of a substrate, the filter layer including a first etch characteristic and a first transmittance;
    a barrier layer formed on at least a portion of the filter layer, the barrier layer including a second etch characteristic; and
    an absorber layer formed on at least a portion of the barrier layer, the absorber layer including the first etch characteristic and a second transmittance, the second etch characteristic of the barrier layer inert to an etch process used to form a pattern in the absorber and filter layers.

13. The photomask of claim 12, further comprising the first transmittance associated with the filter layer greater than the second transmittance associated with the absorber layer.

14. The photomask of claim 12, further comprising the second transmittance associated with the absorber layer approximately equal to zero.

15. The photomask of claim 12, further comprising the first transmittance associated with the filter layer less than approximately fifty percent.

16. The photomask of claim 12, further comprising a plurality of absorber and a plurality of filter layers separated by a plurality of barrier layers.

17. The photomask of claim 12, further comprising:
    the absorber layer and the filter layer including a first etch characteristic; and
    the barrier layer including a second etch characteristic different from the first etch characteristic.

18. The photomask of claim 12, wherein the filter layer comprises a material selected from the group consisting of a nickel alloy, a nickel-chromium alloy, a nickel-chromium-iron alloy, and a chromium alloy.

19. The photomask of claim 12, wherein the barrier layer comprises a material selected from the group consisting of aluminum nitride (AlN), silicon nitride ($Si_3N_4$), tantalum oxide ($Ta_2O_5$), yttrium oxide ($Y_2O_3$), magnesium oxide (MgO), zirconium oxide ($ZrO_2$), lithium fluoride (LiF), aluminum fluoride ($AlF_3$), and calcium fluoride ($CaF_2$).

20. A method for manufacturing a photomask, comprising:

providing a photomask blank including a barrier layer located between an absorber layer and a filter layer, the filter layer formed on at least a portion of a substrate;

forming a first pattern in the absorber layer with a first etch process, the barrier layer operable to stop the first etch process;

forming a second pattern in the barrier layer with a second etch process; and forming the second pattern in the filter layer with a third etch process.

21. The method of claim 20, wherein:

the first and third etch processes comprise a wet etch; and the second etch process comprises a dry etch.

22. The method of claim 20, wherein:

the absorber layer and filter layer comprise a first etch characteristic;

the baffler layer comprises a second etch characteristic; and the first, second and third etch processes comprise a dry etch.

23. The method of claim 20, wherein the barrier layer comprises a material inert to the third etch process.

24. The method of claim 20, wherein the filter layer comprises a neutral density material.

25. The method of claim 20, further comprising:

the filter layer including a first transmittance; and the absorber layer including a second transmittance, the first transmittance greater than the second transmittance.

* * * * *